(12) United States Patent
Someno et al.

(10) Patent No.: US 8,353,608 B2
(45) Date of Patent: Jan. 15, 2013

(54) LIGHT-EMITTING DEVICE WITH 2-AXIS ATTITUDE ADJUSTABLE HOLDER

(75) Inventors: Yoshihiro Someno, Miyagi-ken (JP); Toshiaki Konno, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 13/398,147

(22) Filed: Feb. 16, 2012

(65) Prior Publication Data
US 2012/0147602 A1 Jun. 14, 2012

Related U.S. Application Data

(63) Continuation of application No. PCT/JP2010/065475, filed on Sep. 9, 2010.

(30) Foreign Application Priority Data

Sep. 15, 2009 (JP) ................................. 2009-213193

(51) Int. Cl.
*F21V 21/14* (2006.01)
(52) U.S. Cl. ........ 362/421; 362/429; 362/548; 362/549; 248/288.31; 403/56; 403/349
(58) Field of Classification Search ................ 362/548, 362/549, 349, 528, 418, 419, 421, 427, 429; 248/288.3, 288.31; 403/56, 349
See application file for complete search history.

(56) References Cited

U.S. PATENT DOCUMENTS

| | | | | | |
|---|---|---|---|---|---|
| RE15,607 | E | * | 5/1923 | Vallot | 362/528 |
| 2,782,295 | A | * | 2/1957 | Schwenkler | 362/365 |
| 3,581,081 | A | * | 5/1971 | Rieth | 362/382 |
| 3,679,890 | A | * | 7/1972 | Pool | 362/275 |
| 4,499,528 | A | * | 2/1985 | Hawlitzki | 362/275 |
| 4,513,356 | A | * | 4/1985 | Mikola | 362/645 |
| 4,774,645 | A | * | 9/1988 | Iwamoto | 362/652 |
| 4,922,388 | A | * | 5/1990 | Freudenreich | 362/519 |
| 4,947,294 | A | * | 8/1990 | Van Duyn et al. | 362/519 |
| 5,440,462 | A | * | 8/1995 | Kim et al. | 362/105 |
| 6,315,432 | B1 | * | 11/2001 | Kuo | 362/287 |
| 6,371,628 | B1 | * | 4/2002 | Ward | 362/287 |
| 2002/0145871 | A1 | * | 10/2002 | Yoda | 362/241 |
| 2003/0123499 | A1 | | 7/2003 | Ohgiyama et al. | |
| 2006/0139718 | A1 | | 6/2006 | Ishihara | |

FOREIGN PATENT DOCUMENTS

| | | |
|---|---|---|
| JP | 3-40478 | 2/1991 |
| JP | 2005-311203 | 11/2005 |
| JP | 2008-10492 | 1/2008 |

OTHER PUBLICATIONS

Search Report dated Dec. 14, 2010 from International Application No. PCT/JP2010/065475.

* cited by examiner

*Primary Examiner* — Ismael Negron
(74) *Attorney, Agent, or Firm* — Beyer Law Group LLP

(57) ABSTRACT

A holding hole of a holding body has an edge portion and an inner peripheral surface which is a concavely curved surface connected to the edge portion. In a light source unit which supports a light source, projections are formed at three locations, and each of front surfaces thereof has a convexly curved line having a curvature radius longer than that of the inner peripheral surface. When the light source unit is inserted into the holding hole, the front surfaces of the projections at the three locations are brought into point contact with the edge portion at contact portions on the convexly curved lines.

10 Claims, 8 Drawing Sheets

LIGHT-EMITTING DEVICE WITH 2-AXIS ATTITUDE ADJUSTABLE HOLDER

CLAIM OF PRIORITY

This application is a Continuation of International Application No. PCT/JP2010/065475 filed on Sep. 9, 2010, which claims benefit of Japanese Patent Application No. 2009-213193 filed on Sep. 15, 2009. The entire contents of each application noted above are hereby incorporated by reference.

BACKGROUND OF THE INVENTION

1. Field of the Invention

The present invention relates to an optical device in which the optical axis of a light source unit including a light source can be adjusted so as to be appropriately directed and the light source unit can be fixed to a holding body.

2. Description of the Related Art

A light-emitting device in which a light source unit including a light source is held is used in various information processing apparatuses. In such a light-emitting device, the light source unit has to be adjusted in tilt attitude and fixed such that the optical axis of light emitted from the light source unit is appropriately directed.

Japanese Unexamined Patent Application Publication No. 2008-10492 discloses a light-emitting device mounted on an optical head apparatus. In the light-emitting device, the outer peripheral surface of an element-side holder which supports a semiconductor laser is a convexly curved surface having an arcuate cross-sectional shape, a positioning region formed at an opening of a fixed-side holder is a concavely curved surface having an arcuate cross-sectional shape, and the curvature radii of the convexly curved surface and the concavely curved surface are the same.

The convexly curved surface is brought into contact with the concavely curved surface, and the convexly curved surface and the concavely curved surface are slid relative to each other to change the tilt angle of the element-side holder, thereby adjusting the optical axis of the semiconductor laser. After the adjustment, the element-side holder is fixed to the fixed-side holder by means of an anaerobic adhesive.

In the light-emitting device disclosed in Japanese Unexamined Patent Application Publication No. 2008-10492, the convexly curved surface in the element-side holder and the concavely curved surface in the fixed-side holder are formed so as to have the same curvature radius and are brought into contact with each other entirely around the optical axis. However, since there is a limit on processing accuracy of the convexly curved surface and the concavely curved surface, it is impossible to accurately cause the convexly curved surface and the concavely curved surface to closely contact each other entirely around the optical axis, and the gap in the fitted portion between the element-side holder and the fixed-side holder is likely to vary depending on a location around the optical axis. Therefore, the adhesion stress by the adhesive interposed between both holders is different depending on a location, and an angle shift of the optical axis is likely to occur when the adhesive is cured after the optical axis is adjusted.

Further, in the structure in which the element-side holder and the fixed-side holder are fixed to each other by means of the adhesive, the adhesive is likely to alter due to temperature change, and thus the fixing stress by the adhesive changes during a long period of use, and problems such as change in the angle of the optical axis of the semiconductor laser are likely to arise.

SUMMARY OF THE INVENTION

The present invention is intended to solve the existing problems described above and provides a light-emitting device in which after a light source unit is positioned to a holding body, the light source unit can be fixed to the holding body with the positioned state maintained.

Further, the present invention provides a light-emitting device in which a light source unit can be firmly fixed to a holding body and tilting of an optical axis and the like are less likely to occur even when the light-emitting device is used for a long period of time.

The present invention provides a light-emitting device including: a light source unit including a light source and a lens; and a holding body holding the light source unit. The holding body has a holding hole to which the light source unit is inserted. The light source unit is provided with projections at three locations, and the projections extend in a direction away from a center line of the holding hole. A shape of a front surface of each projection which is cut by a plane including the center line is a convexly curved line. In a state where the front surface of each projection is in contact with an edge portion of the holding hole and an optical axis of the light source unit is directed in a predetermined direction, the front surface of each projection and the edge portion are fixed to each other.

In the light-emitting device of the present invention, the front surfaces of the projections provided in the light source unit at the three locations have the convexly curved lines and are brought into contact with the edge portion. Thus, the front surfaces of all the projections and the edge portion can assuredly be brought into contact with each other. The variation of the fixed state between the front surface of each projection and the edge portion can be reduced. Thus, after the direction of the light source unit is adjusted and the fixing operation is performed, the adjusted attitude of the light source unit is easily maintained. In addition, the light source unit and the holding body are fixed to each other at least at the three locations. Thus, biased stress can be prevented from being applied to the light source unit, and even if the temperature changes when the light-emitting device is used, the direction of the light source unit is less likely to shift from a desired direction.

In the present invention, preferably, the convexly curved lines of the projections at the three locations are located on imaginary spherical surfaces having curvature centers on the center line.

In this structure, by pressing the light source unit against the edge portion of the holding hole of the holding body and tilting the light source unit about the curvature center, it is made possible to perform the fixing operation after the direction of the light source unit is smoothly adjusted.

In the present invention, preferably, a shape of an inner peripheral surface of the holding hole which is cut by a plane including the center line is a concavely curved line having a curvature radius smaller than that of the convexly curved line of each projection, and the inner peripheral surface is connected to the edge portion.

When the inner peripheral surface of the holding hole is formed as the concavely curved surface having a small curvature radius, the gap between the front surface of each projection and the inner peripheral surface of the holding hole can be minute near the contact portion between the projection and the edge portion. Thus, a large gap can be prevented from being formed at a welded portion, a stable fixed state can be realized, and, for example, stable weld quality can be realized.

In this case, preferably, the concavely curved line of the inner peripheral surface is located on an imaginary spherical surface having a curvature center on the center line.

Further, in the present invention, preferably, a shape of the front surface of each projection which is cut by a plane which includes a contact portion between the projection and the edge portion and is orthogonal to the center line is a convexly curved line having a curvature radius smaller than that of the holding hole.

In the above configuration, the front surface of each projection and the holding hole of the holding body can be theoretically brought into point contact with each other, and the light source unit is held by the holding body in a stable attitude by the contact portions at the three locations. In addition, the gap between each projection and the holding hole is minute around the contact portion, and the fixed state at each fixed portion, for example, the weld quality of the welded portion, is easily stabilized.

In the present invention, each projection and the edge portion may be welded to each other. In this case, the welding is possible with the energy of a laser beam. In addition, since the light source unit and the holding body are fixed to each other by means of welding, the attitude of the light source unit is less likely to shift even when the light-emitting device is used or the environmental temperature greatly changes.

It should be noted that fixing the projections to the edge portion is not limited to welding and may be performed by fixing means such as adhesion.

Further, in the present invention, the light source unit and the holding body may be provided at a plurality of locations, and the optical axes of the light source units may coincide with each other along a line.

In the optical device, the tilt attitude of each light source unit can be finely adjusted, and the light source unit and the holding body can be fixed to each other. Thus, the optical axes of light emitted from the plurality of light source units are easily caused to coincide with each other on the same line, and the direction of each optical axis is less likely to shift from a desired direction.

However, the present invention may provide a light-emitting device in which one light source unit is held by one holding body. In this case, light emitted from the light source unit can be applied to another optical element or a recording medium such that the optical axis of the light is precisely directed, and it is possible to finely adjust and fix the light source unit.

DESCRIPTION OF THE PREFERRED EMBODIMENTS

Figure 1:
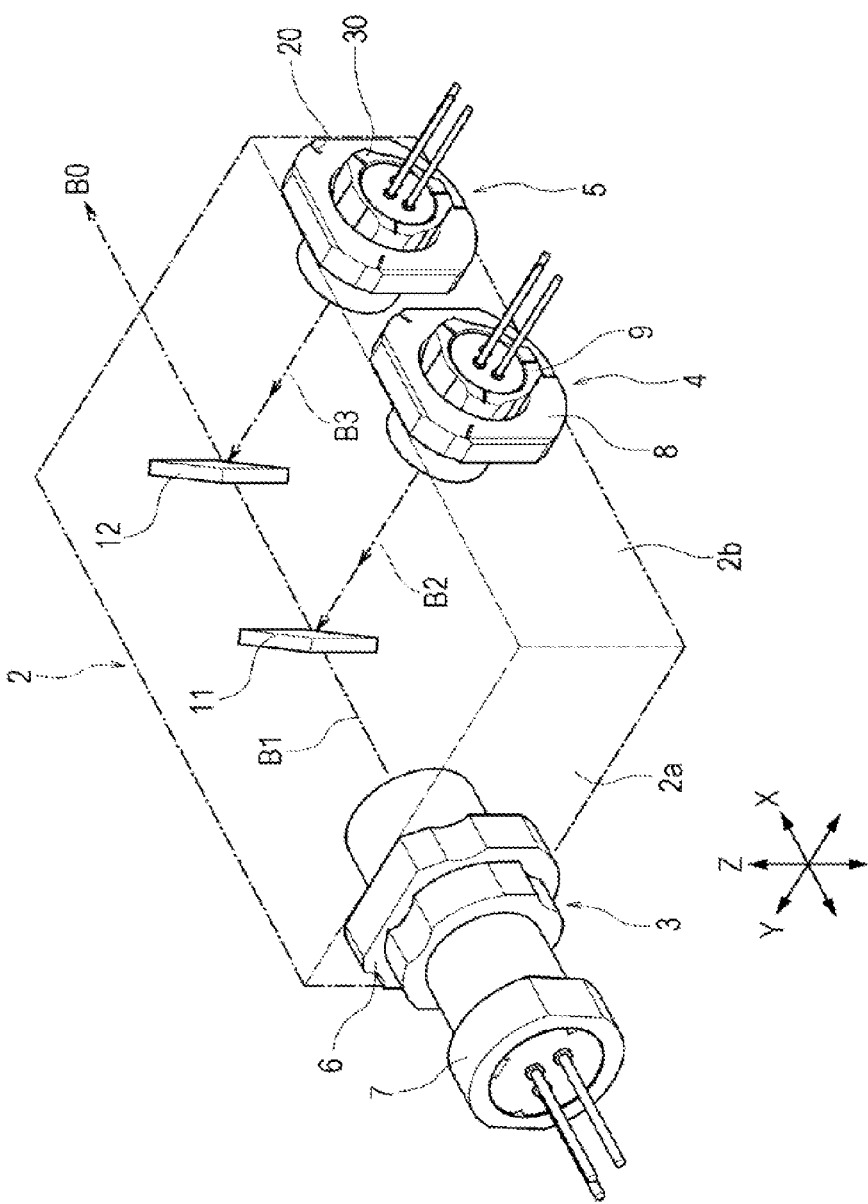
FIG. 1 is a perspective view showing a light-emitting device according to an embodiment of the present invention.
Figure 2:
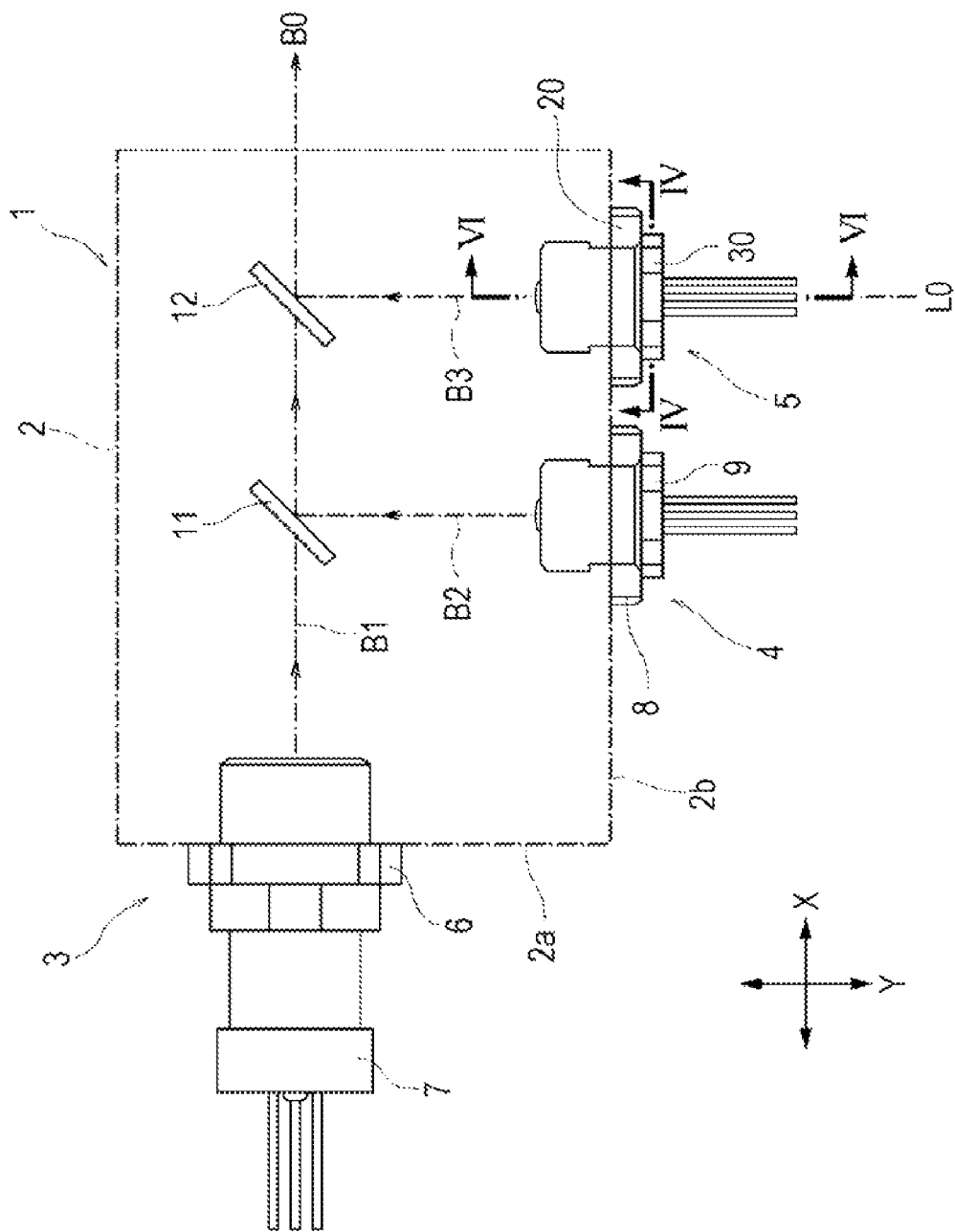
FIG. 2 is a plan view of the light-emitting device.

A light-emitting device 1 shown in FIGS. 1 and 2 includes a case 2 having a cubic shape. A first light source attachment section 3 is provided in an end surface 2a of the case 2, and a second light source attachment section 4 and a third light source attachment section 5 are provided in a side surface 2b of the case 2. The end surface 2a and the side surface 2b are perpendicular to each other.

In the first light source attachment section 3, a holding body 6 is fixed to the end surface 2a of the case 2, and a light source unit 7 is positioned and fixed to the holding body 6.

In the second light source attachment section 4, a holding body 8 is fixed to the side surface 2b of the case 2, and a light source unit 9 is fixed to the holding body 8. The holding body 8 is adjusted in position in the vertical direction (Z direction) and the lateral direction (X direction), and then is fixed to the side surface 2b. In addition, the light source unit 9 is adjusted in tilt angle with respect to a Y axis, and then positioned and fixed to the holding body 8.

In the third light source attachment section 5, a holding body 20 is fixed to the side surface 2b of the case 2, and a light source unit 30 is fixed to the holding body 20. The holding body 20 is adjusted in position in the vertical direction (Z direction) and the lateral direction (X direction), and then is fixed to the side surface 2b. In addition, the light source unit 30 is adjusted in tilt angle with respect to the Y axis, and then positioned and fixed to the holding body 20.

Within the case 2, two band-pass filters 11 and 12 are provided so as to be spaced apart from each other in the X direction. The band-pass filters 11 and 12 are installed so as to be tilted at 45 degrees with respect to the X axis and the Y axis.

The wavelengths of light emitted from light sources provided in the light source unit 7, the light source unit 9, and the light source unit 30, respectively, are different from each other. The band-pass filter 11 and the band-pass filter 12 are different in transmission characteristics and reflection characteristics from each other. The band-pass filter 11 transmits the light emitted from the light source unit 7, and reflects the light emitted from the light source unit 9. The band-pass filter 12 transmits both the light emitted from the light source unit 7 and the light emitted from the light source unit 9, and reflects the light emitted from the light source unit 30.

In the second light source attachment section 4, the holding body 8 is adjusted in attachment position and fixed, and the light source unit 9 is adjusted in tilt attitude and fixed to the holding body 8, whereby the optical axis B1 of the light from the light source unit 7 which is transmitted through the band-pass filter 11 and the optical axis B2 of the light from the light source unit 9 which is reflected by the band-pass filter 11 can be caused to substantially coincide with each other. In addition, in the third light source attachment section 5, the holding body 20 is adjusted in attachment position and fixed, and the light source unit 30 is adjusted in tilt attitude and fixed to the holding body 20, whereby the optical axis B1 of the light from the light source unit 7 which is transmitted through the band-pass filters 11 and 12 and the optical axis B2 of the light from the light source unit 9 can be caused to substantially coincide with the optical axis B3 of the light from the light source unit 30 which is reflected by the band-pass filter 12.

In the light-emitting device 1 shown in FIG. 1, the light emitted from the different light source units 7, 9, and 30 can be outputted as light of the same optical axis B0. Thus, the light which is emitted from the light source units 7, 9, and 30 and has different wavelengths and different colors can be switched one after another and emitted along the same optical axis B0. For example, the light emitted from the light source units 7, 9, and 30 has a wavelength of R (red), a wavelength of G (green), and a wavelength of B (blue), and an optical actuator which bends the optical axis B0 to perform scanning in a longitudinal direction and a transverse direction is provided forward of the optical axis B0, whereby a laser scan type projector capable of performing color display can be configured.

The light sources accommodated in the light source units 7, 9, and 30 may be light-emitting diodes. However, when semiconductor lasers are used, the color of an image projected on a screen is made vivid, and it is made possible to increase the straightness of light and to project an image of high resolution.

Next, with reference to FIG. 3, the structures of the holding body 20 and the light source unit 30, which are provided in the third light source attachment section 5, and an operation to adjust the tilt attitude of the light source unit 30 and to fix the light source unit 30, will be described. The structures of the holding body 8 and the light source unit 9 in the second light source attachment section 4 are substantially the same as the structures of the holding body 20 and the light source unit 30, and thus the description thereof is omitted.

In the light-emitting device 1 shown in FIG. 1, the optical axis B1 of the light from the light source unit 7 is used as a reference, and the optical axis B2 of the light from the light source unit 9 and the optical axis B3 of the light from the light source unit 30 are adjusted so as to coincide with the optical axis B1. Thus, in the first light source attachment section 3, it is unnecessary to adjust the light source unit 7 in position in the Y and Z directions and in tilt with respect to the X axis. However, the structures of the holding body 6 and the light source unit 7 in the first light source attachment section 3 may be the same as the structures of the holding body 20 and the light source unit 30 in the third light source attachment section 5, and it may be made possible to adjust the optical axis B1 of the light, emitted from the light source unit 7, in the Y and Z directions to adjust the tilt of the optical axis B1.

The holding body 20 shown in FIGS. 3 to 7 is formed from a metal material that is easily welded, such as stainless steel (a Ni—Cr—Fe alloy)

Figure 3:
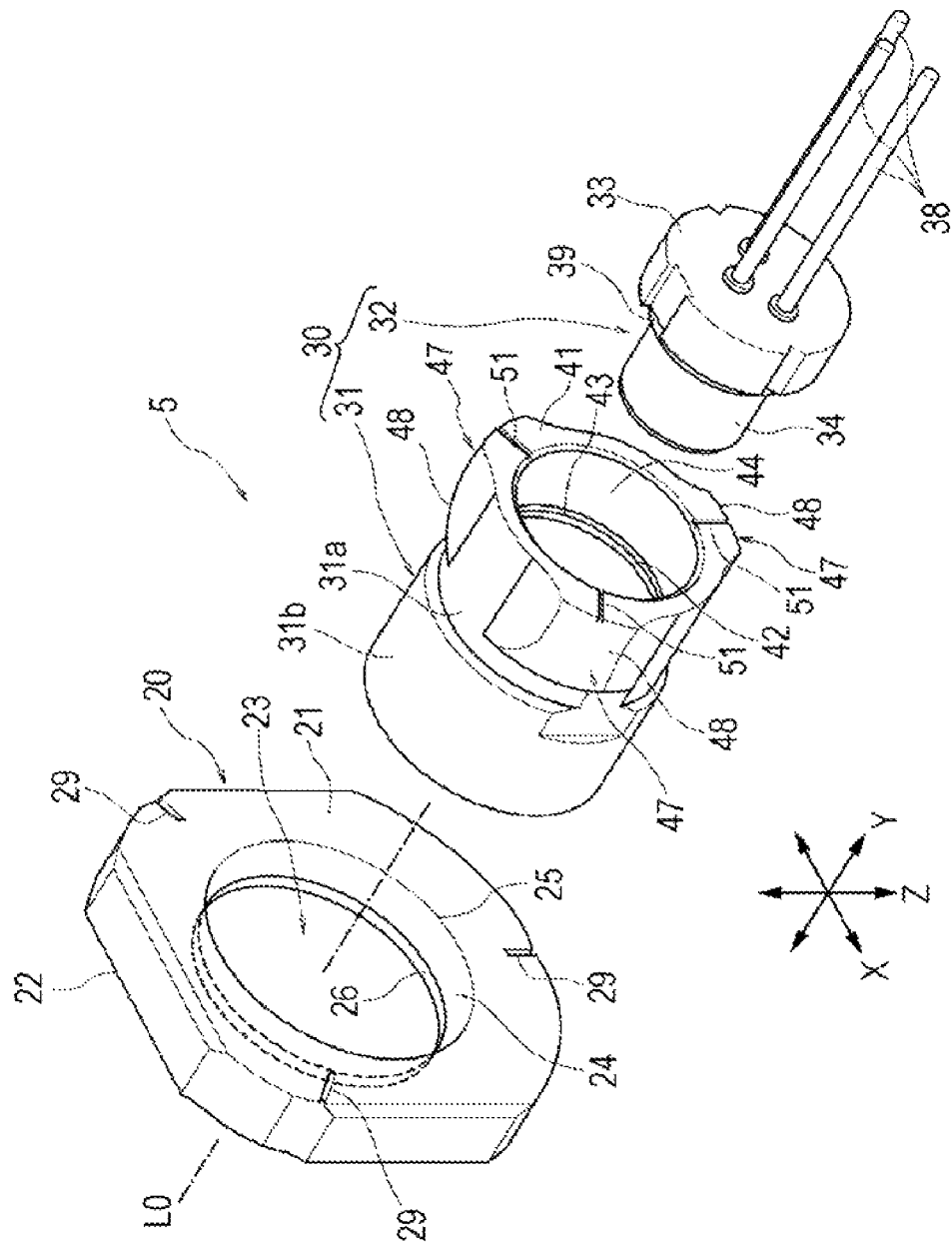
FIG. 3 is an exploded perspective view showing a state of attaching a light source unit and a holding body.
Figure 6:
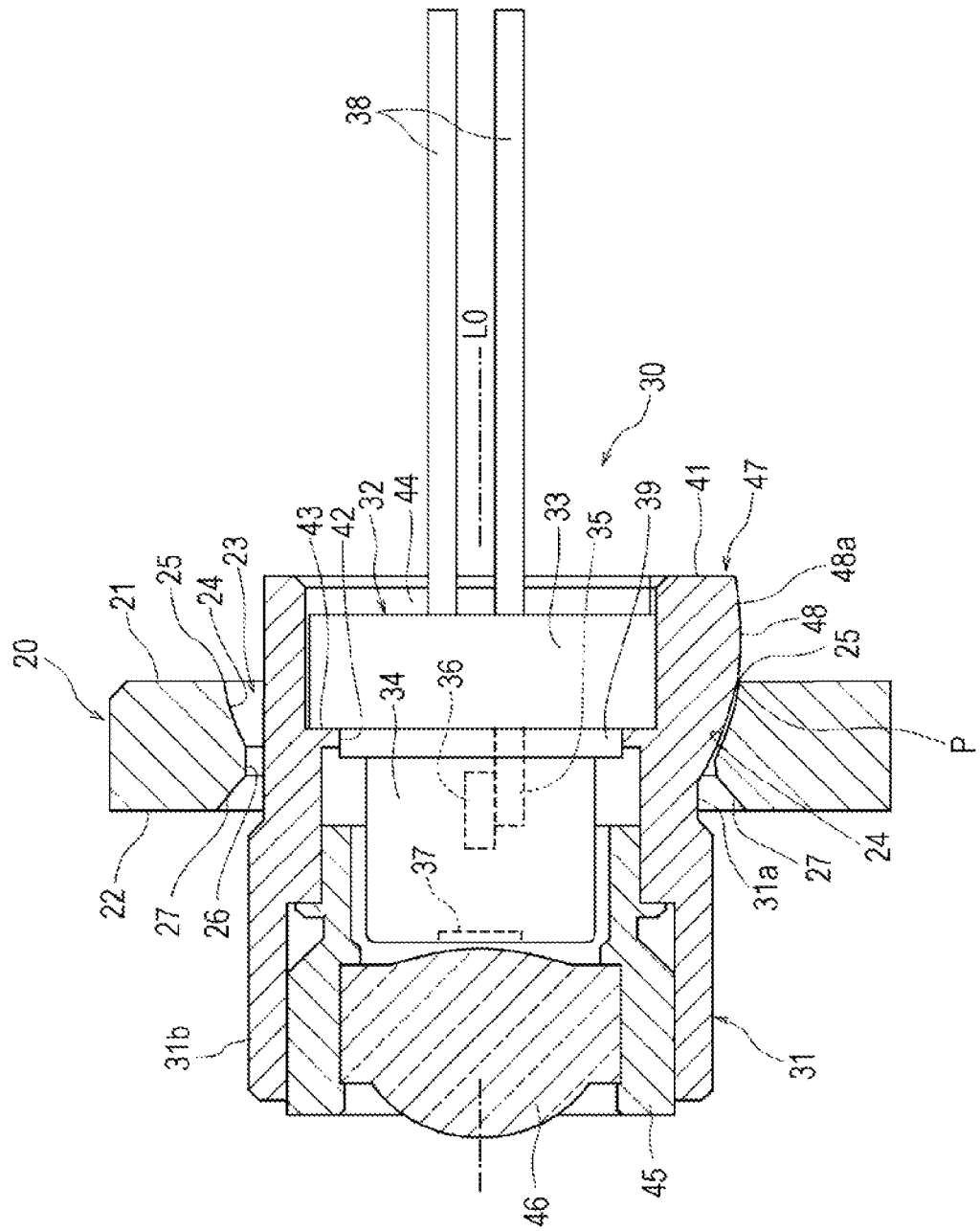
FIG. 6 is a cross-sectional view of the light source unit and the holding body, taken along the VI-VI line in FIG. 2 including the center line.

As shown in FIGS. 3 and 6, a front surface 21 and a back surface 22 of the holding body 20 are parallel to each other. The back surface 22 of the holding body 20 is brought into close contact with the side surface 2b of the case 2, and the holding body 20 is adjusted in position in the X and Y directions and is fixed to the side surface 2b.

The holding body 20 has a holding hole 23 extending therethrough in the Y direction. The holding hole 23 has a perfect circle shape, and FIGS. 3 and 6 and the like show, as a center line L0, an imaginary line which passes through the opening center of the holding hole 23 and extends in the Y direction.

Figure 7:
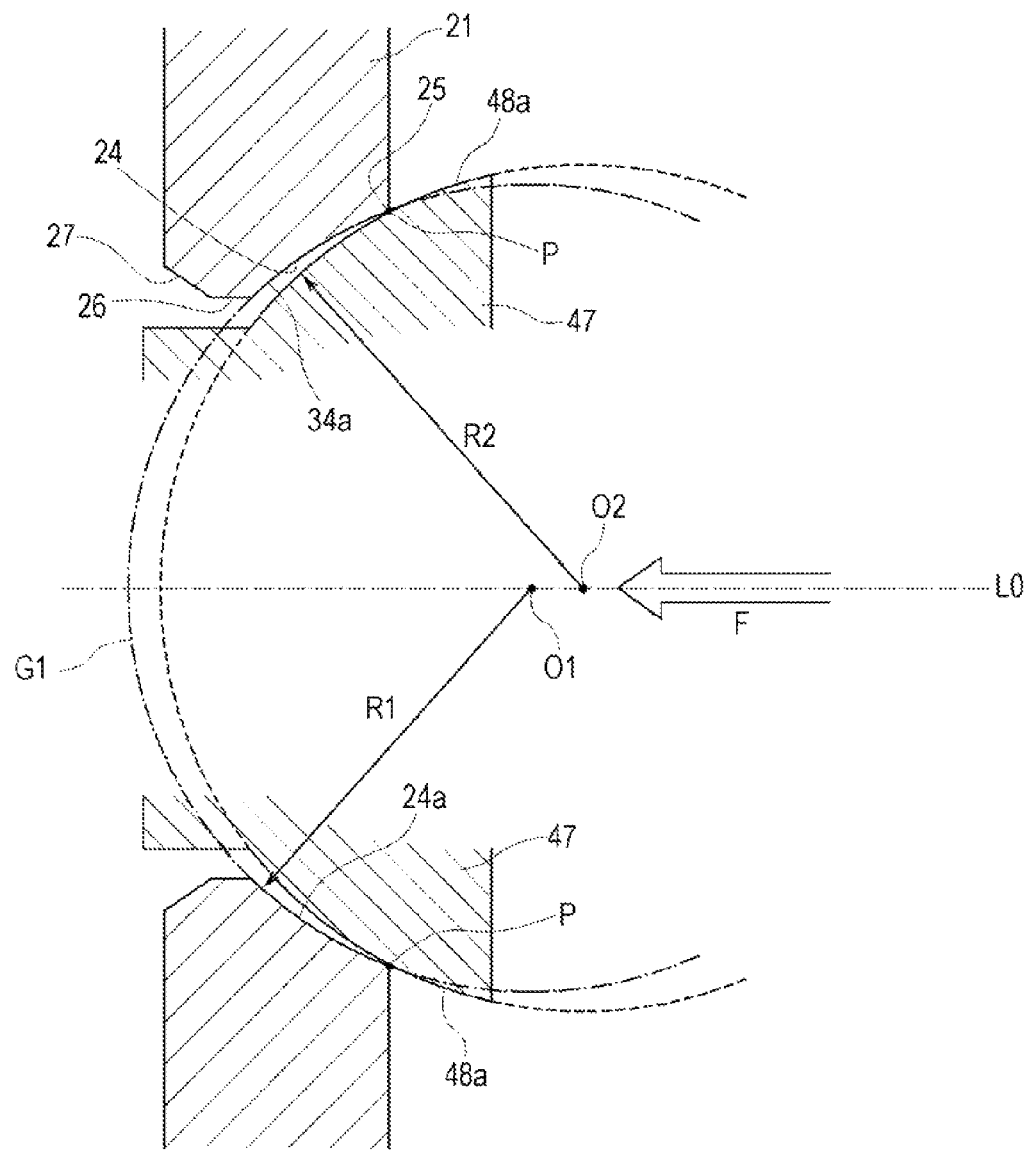
FIG. 7 is a cross-sectional view schematically illustrating a contact state between the light source unit and the holding body shown in FIG. 4.

The holding hole 23 has an inner peripheral surface 24 opened to the front surface 21 side. The inner peripheral surface 24 is a concavely curved surface facing the center line L0. The inner peripheral surface 24 is formed continuously and entirely around the center line L0, and the entirety of the inner peripheral surface 24 coincides with an imaginary spherical surface G1 having a radius R1 having a curvature center O1 on the center line L0, as schematically shown in FIG. 7.

The boundary between the front surface 21 of the holding body 20 and the inner peripheral surface 24 is an edge portion 25. Since the inner peripheral surface 24 is formed continuously and entirely around the center line L0, the edge portion 25 is formed along the trajectory of a perfect circle having a curvature center on the center line L0. The edge portion 25, which is the boundary between the front surface 21 and the inner peripheral surface 24, theoretically appears as a point in the cross sections shown in FIGS. 6 and 7, but in reality, a chamfered portion and a minute curved surface may appear in the edge portion 25 in the cross sections.

As shown in FIG. 6, the inner periphery of the holding hole 23 of the holding body 20 has a minimum-diameter portion 26 connected to the inner peripheral surface 24 which coincides with the imaginary spherical surface G1, and a tapered surface 27 which is connected to the minimum-diameter portion 26 and gradually increases in diameter toward the back surface 22.

As shown in FIGS. 3 and 6, the light source unit 30 includes an external case 31 and an internal case 32.

As shown in FIG. 6, the internal case 32 includes a base 33 formed from a metal material that is easily welded, such as stainless steel, and a cylindrical metal cover 34 fixed in front of the base 33. As shown in FIG. 6, the metal cover 34 is hollow, is covered at its left side in the drawing, namely, at its front in the light-emitting direction, with a cover glass 37, and is closed at the other portion so as to not pass light. Within the metal cover 34, a support member 35 is provided and fixed to the base 33. A light source 36 is mounted on the support member 35. In rear of the base 33, a conductive terminal 38 for energizing the light source 36 extends.

The light source 36 is a chip of a semiconductor laser. A laser beam of a wavelength which can be reflected by the band-pass filter 12 shown in FIGS. 1 and 2 is emitted from the light source 36, is transmitted through the cover glass 37 and is outputted forward.

The external case 31 is formed from stainless steel which is a metal material that is easily welded. The external case 31 has a front surface 41 which is a flat surface facing toward the right side of the drawing, and has a through hole extending therethrough longitudinally along an axis orthogonal to the front surface 41. As shown in FIGS. 3 and 6, in the through hole of the external case 31, a positioning peripheral surface 42 is formed so as to have the smallest inner diameter, and a contact surface 43 is formed parallel to the front surface 41 and on the right side of the positioning peripheral surface 42. A relief hole 44 having a large diameter is formed on the right side of the contact surface 43.

The internal case 32 is inserted into the through hole of the external case 31 from its metal cover 34 side. As shown in FIG. 6, a reference portion 39 located at the boundary between the metal cover 34 and the base 33 is fitted into the positioning peripheral surface 42, and a surface of the base 33 which faces toward the left side is brought into contact with the contact surface 43, whereby the internal case 32 is positioned within the external case 31. Then, the external case 31 and the base 33 are fixed to each other by means of laser welding, an adhesive, or the like.

As shown in FIG. 6, a lens holder 45 is fitted into the light-emitting-side opening of the through hole of the external case 31, and is positioned and fixed therein. The lens holder 45 is formed from a metal material that is easily welded, such as stainless steel, and is fixed to the external case 31 by means of laser welding, an adhesive, or the like. A lens 46 is held by the lens holder 45 and fixed by means of an adhesive or the like.

In the light source unit 30, the laser beam emitted from the light source 36 is transmitted through the cover glass 37, is reduced in diameter by the lens 46 to be converted into converging light or the like, and is outputted.

Figure 4:
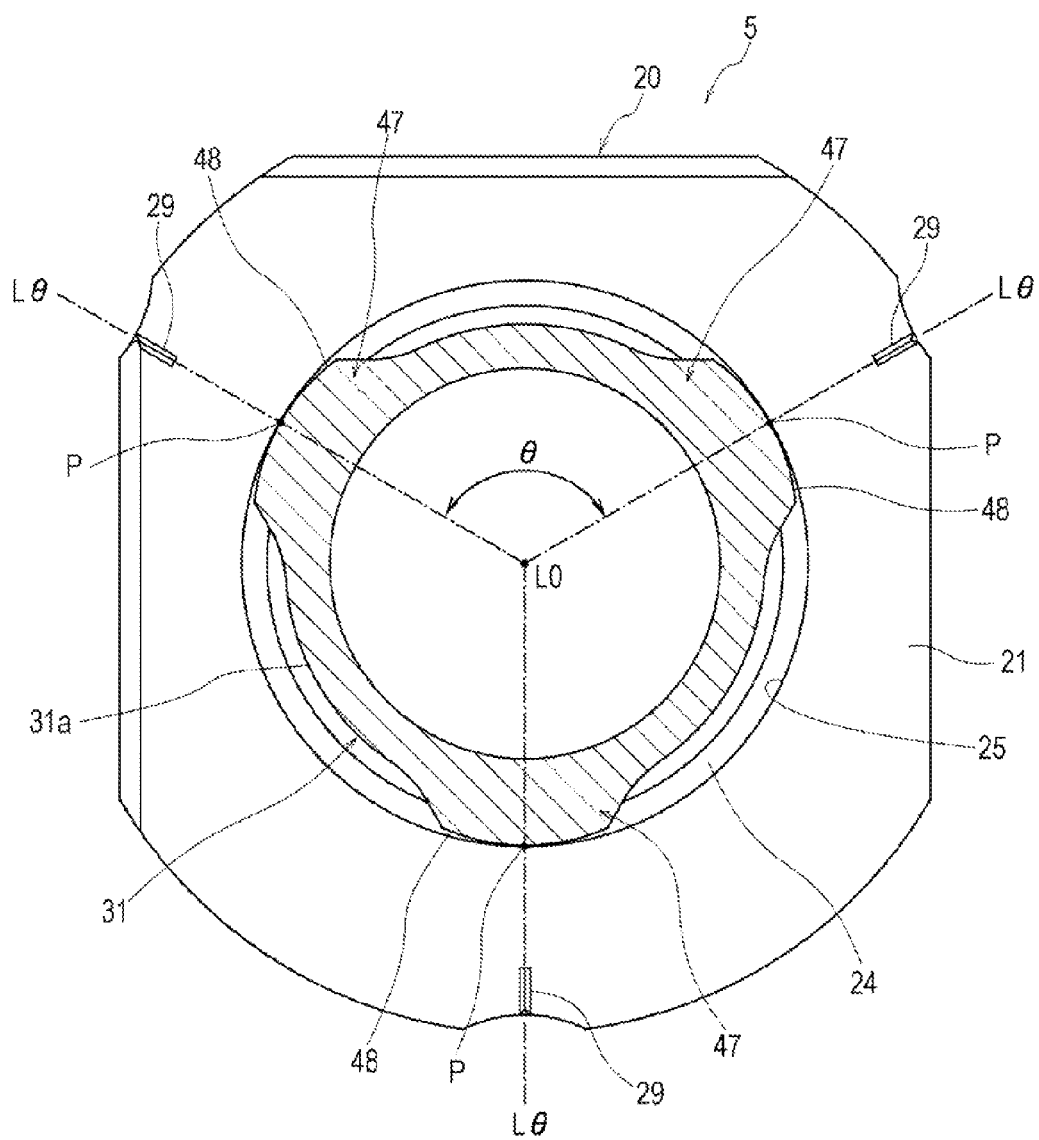
FIG. 4 is a cross-sectional view of the light source unit and the holding body, taken along the IV-IV line in FIG. 2 which passes through a contact portion between the light source unit and the holding body and is orthogonal to a center line.

As shown in FIGS. 3 and 4, in the external case 31, the outer peripheral surface of a right-side portion which holds the internal case 32 in the external case 31 is a small-diameter cylindrical surface 31a, and the outer peripheral surface of a left-side portion which holds the lens holder 45 is a large-diameter cylindrical surface 31b larger in diameter than the small-diameter cylindrical surface 31a.

As shown in FIGS. 3 and 6, projections 47 are integrally formed on the outer peripheral surface of the external case 31 and project from the small-diameter cylindrical surface 31a at three locations. The projections 47 project toward the normal direction away from the center line L0 and are located around the center line L0 at angle intervals of 120 degrees. The projections 47 at the three locations are formed so as to have the same shape and the same dimension.

As shown in FIG. 6, the light source unit 30 is inserted into the holding hole 23 of the holding body 20 from the large-diameter cylindrical surface 31b side of the external case 31. Then, the front surfaces 48 of the projections 47 projecting from the external case 31 are brought into contact with the edge portion 25 at the opening of the holding hole 23 of the holding body 20, whereby the light source unit 30 is positioned to the holding body 20.

FIG. 4 shows three radial imaginary lines L$\theta$ extending from the center line L0 in the radial direction. The open angle $\theta$ of the three radial imaginary lines L$\theta$ is 120 degrees. The front surface 48 of each projection 47 and the edge portion 25 are brought into contact with each other at a contact portion P on the radial imaginary line L$\theta$. At the contact portion P, the front surface 48 of the projection 47 and the edge portion 25 are geometrically in point contact with each other. However, in reality, a minute chamfer may be formed in the edge portion 25, and the edge portion 25 and the front surface 48 may be deformed. Thus, the contact at the contact portion P is not necessarily limited to strict point contact.

FIG. 4 shows a state where the external case 31 of the light source unit 30 is cut by a plane which includes the three contact portions P between the edge portion 25 and the front surfaces 48 of the projections 47 and is orthogonal to the center line L0. In addition, FIG. 5 shows the one contact portion P appearing in the cross section of FIG. 4, in an enlarged manner.

Figure 5:
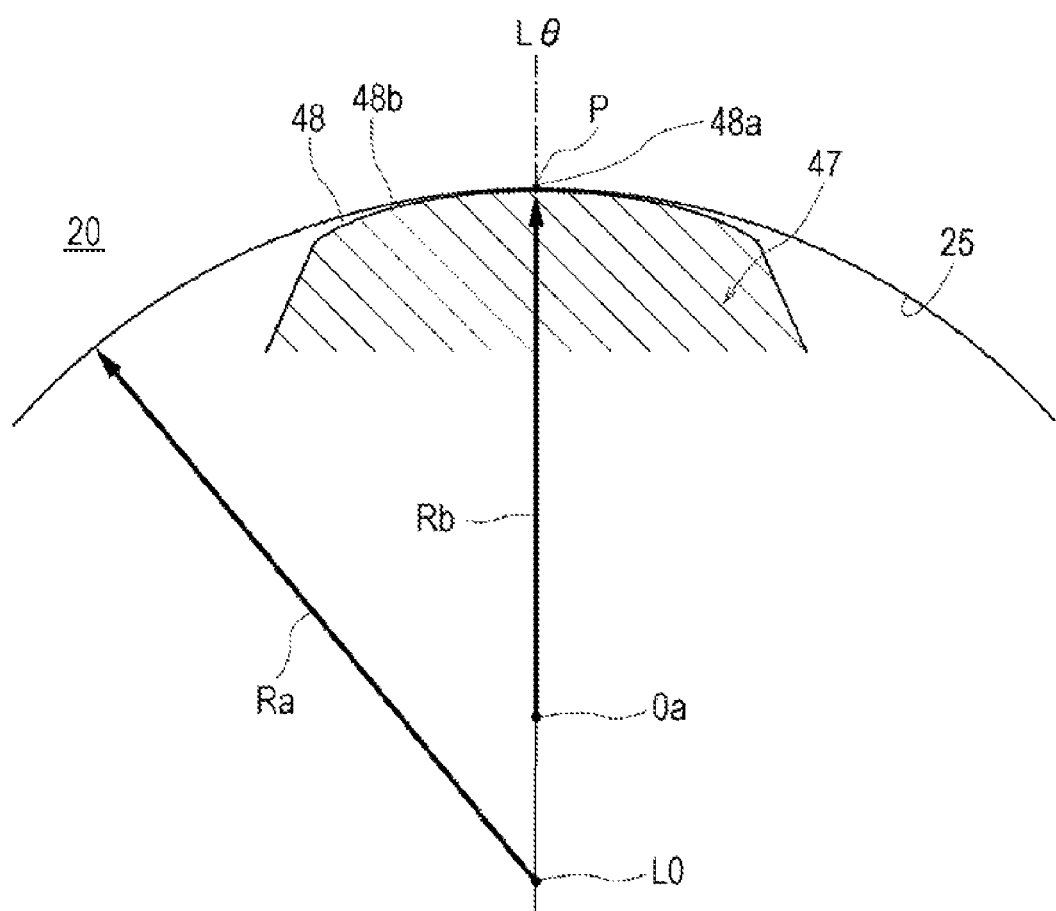
FIG. 5 is a partially enlarged cross-sectional view schematically showing a portion of FIG. 4 in an enlarged manner.

As shown in FIGS. 4 and 5, the front surface 48 of each projection 47 appears as a convexly curved surface 48b when being seen in the cross section including the contact portion P. The edge portion 25 has a perfect circle shape having a radius Ra having a curvature center on the center line L0, and the curvature radius Rb of the convexly curved surface 48b at the contact portion P is shorter than the radius Ra of the edge portion 25. The convexly curved surface 48b is an arcuate curved line located on a perfect circle of the radius Rb having a curvature center Oa on the radial imaginary line L$\theta$. However, the convexly curved surface 48b is not necessarily limited to the arcuate curved line of the perfect circle.

As shown in the cross sections of FIGS. 4 and 5, each contact portion P is present on the convexly curved surface 48b of the front surface 48 of the projection 47 and on the radial imaginary line L$\theta$. Since the curvature radius Rb of the convexly curved surface 48b is shorter than the curvature radius Ra of the edge portion 25, the interval between the front surface 48 of the projection 47 and the edge portion 25 gradually increases as distance from the contact portion P increases toward the clockwise direction and the counter-clockwise direction.

FIG. 6 shows a cross section obtained by cutting the one projection 47 by a plane including the radial imaginary line L$\theta$, and FIG. 7 schematically shows cross sections obtained by cutting the two projections 47 by planes including the corresponding radial imaginary lines L$\theta$⌐, respectively.

In the cross sections of FIGS. 6 and 7, the front surface 48 of each projection 47 appears as a convexly curved line 48a. The convexly curved line 48a is the line of intersection between the front surface 48 and the plane including the radial imaginary line L$\theta$. The convexly curved line 48a of the front surface 48 of each of the projections 47 at the three locations is located on an imaginary spherical surface of a radius R2 having a curvature center O2 located on the center line L0. The contact portions P at the three locations are located on the respective convexly curved lines 48a. Each convexly curved line 48a is a portion of an arc of a perfect circle having the curvature center O2, but may not coincide with the arc of the perfect circle.

As shown in FIG. 7, the curvature radius R2 of the convexly curved line 48a of the front surface 48 of each projection 47 is longer than the curvature radius R1 of a concavely curved line 24a appearing in the cross section of the inner peripheral surface 24 of the holding hole 23 of the holding body 20. In addition, the curvature center O2 of the curvature radius R2 is located farther from the edge portion 25 than the curvature center O1 of the curvature radius R1. Thus, when being seen in the cross sections of FIGS. 6 and 7, the front surface 48 of each projection 47 is in contact with the edge portion 25 at the contact portion P. The gap between the front surface 48 of each projection 47 and the inner peripheral surface 24 of the holding hole 23 gradually widens as distance from the contact portion P increases toward the inside of the holding hole 23.

As shown in FIGS. 3 and 4, on the front surface 21 of the holding body 20, marks 29 are incused at three locations on the radial imaginary lines L$\theta$. On the front surface 41 of the external case 31 of the light source unit 30 as well, marks 51 are incused at three locations on the radial imaginary lines L$\theta$.

Next, a method of positioning and fixing the light source unit 30 to the holding body 20 will be described.

As shown in FIGS. 3 and 6, the internal case 32 having the light source 36 is attached to the external case 31 and the lens holder 45 having the lens 46 is attached to assemble the light source unit 30.

The light source unit 30 is inserted into the holding hole 23 of the holding body 20. At that time, the light source unit 30 is adjusted in position in a rotational direction such that the marks 51 formed in the external case 31 of the light source unit 30 and the marks 29 formed in the holding body 20 coincide with each other along the same lines. When the marks 29 and the marks 51 coincide with each other along the same radial imaginary lines L$\theta$ due to the adjustment in position in the rotational direction, the center of an end portion of the light source unit 30, namely, the center of the front surface of the base 33, is pressed along the center line L0 by a force F along the center line L0, to press the front surfaces 48 of the projections 47 of the external case 31 at the three locations against the edge portion 25 of the holding body 20, as shown in FIG. 7.

When the light source unit 30 is pressed against the holding body 20 by the force F along the center line L0, the front surfaces 48 of the projections 47 and the edge portion 25 are theoretically brought into point contact with each other at the contact portions P on the radial imaginary lines L$\theta$. Since the contact portions P are set at three locations, the front surfaces 48 of the projections 47 and the edge portion 25 are theoretically brought into contact with each other at the respective contact portions P with substantially equal pressure, and thus none of the front surfaces 48 of the projections 47 is extremely strongly pressed against the edge portion 25 or a gap is not formed at any of the contact portions P.

When any of the projections 47 at the three locations is pressed in the Y direction while the force F is applied, the front surface 48 of the projection 47 slides relative to the edge portion 25 at the contact portion P. Thus, with stable contact at the three contact portions P maintained, the attitude of the light source unit 30 can be tilted, and the optical axis B3 shown in FIG. 1 can be tilted with respect to the Y axis to adjust the attitude.

When the direction of the optical axis B3 of the light source unit 30 is adjusted, or prior to the operation of the adjustment, a laser beam is focused on the point of intersection between each radial imaginary line L0 and the edge portion 25. After the adjustment of the tilt attitude is completed, the laser beam is applied to the contact portion between the front surface 48 of each projection 47 and the edge portion 25, and the contact portion is melt with its energy to weld each projections 47 and the edge portion 25.

When being seen in the cross section shown in FIG. 5, the edge portion 25 is a concavely curved line, and the front surface 48 of the projection 47 is the convexly curved surface 48b. Thus, at a position slightly distant from the contact portion P in the clockwise direction or the counterclockwise direction, the gap between the front surface 48 and the edge portion 25 does not greatly widen. Thus, even when the applied position of the laser beam is slightly different from the contact portion P, the welded state at the contact portion P does not greatly vary. In addition, near the contact portion P, the gap between the front surface 48 and the edge portion 25 is small, and thus the weld quality is less likely to vary at the three contact portions P.

The curvature radius R2 of the convexly curved line 48a of the front surface 48 of each projection 47 which appears in the cross section of FIG. 7 is longer than that of the concavely curved line 24a of the inner peripheral surface 24 of the holding hole 23, and the curvature center O2 of the convexly curved line 48a is farther from the edge portion 25 than the curvature center O1 of the concavely curved line 24a. Thus, when the attitude of the light source unit 30 is tilted, the front surfaces 48 of the projections 47 at the three locations are always in contact with the edge portion 25.

Further, in FIG. 7, the gap between the concavely curved line 24a and the convexly curved line 48a gradually widens from the contact portion P toward the left side of the drawing, and the gap between the front surface 48 and the inner peripheral surface 24 does not widen near the contact portion P. Thus, the weld quality of the welded portions at the three contact portions P is less likely to vary.

At the three contact portions P, the front surfaces 48 of the projections 47 are always in contact with the edge portion 25. In addition, at the three contact portions P, the quality of the welded portions is less likely to vary. Thus, great biased stress can be prevented from being applied from the welded portions to the light source unit 30. Therefore, after the adjustment of the attitude of the light source unit 30 and the welding, the light source unit 30 easily maintains its adjusted attitude.

Figure 8:
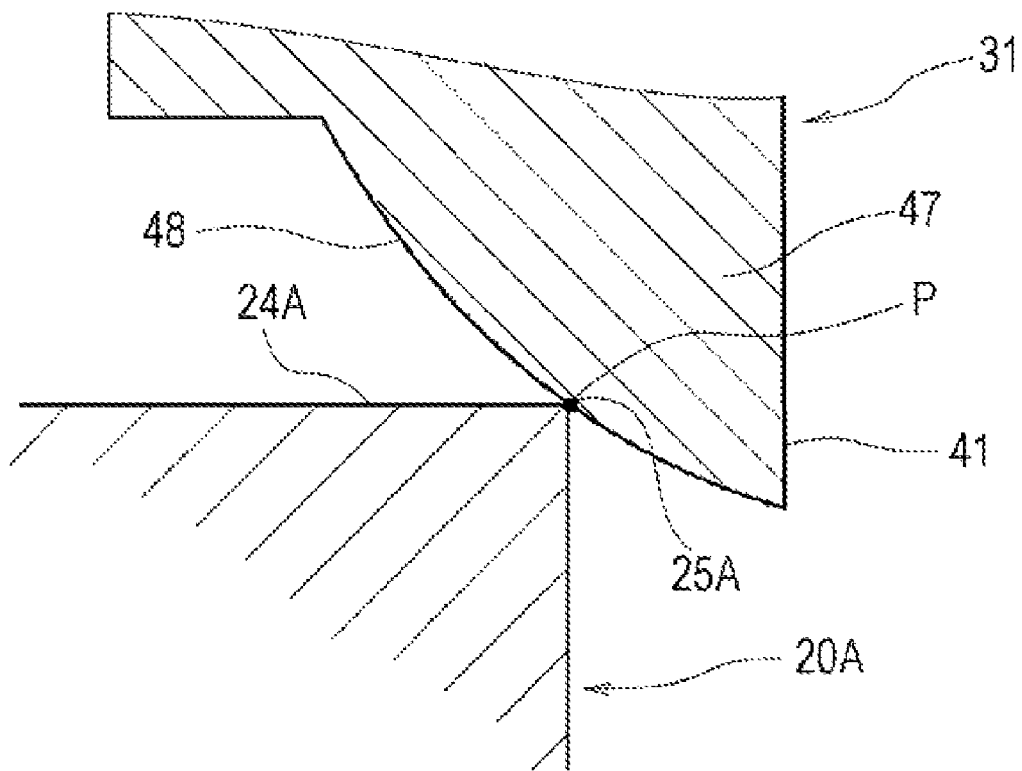
FIG. 8 is a partial cross-sectional view showing a modification of the present invention.

FIG. 8 is a partial cross-sectional view showing a modification of the present invention.

The modification is the same as the embodiment described above, in the shapes of the projections 47 and the front surfaces 48 of the light source unit 30, but an inner peripheral surface 24A of an edge portion 25A of a holding body 20A is not a concavely curved surface but is a cylindrical surface extending in the center line L0 direction.

In FIG. 8 as well, the front surface 48 of the projection 47 and the edge portion 25A can be brought into contact with each other at the contact portion P, and the light source unit 30 and the holding body 20 can be brought into contact with each other at three points. However, near the contact portion P, the gap between the front surface 48 of the projection 47 and the inner peripheral surface 24/24A greatly widens. Thus, in light of stability of weld quality, the embodiment described above as shown in FIG. 7 is preferred.

Similarly, the front surface 48 of the projection 47 shown in FIG. 5 can be formed in a triangular shape of which the width greatly narrows toward the contact portion P. However, in light of stability of weld quality, it is preferred that the front surface 48 of the projection 47 is the convexly curved surface 48b in the cross section of FIG. 5.

What is claimed is:

1. A light-emitting device comprising:
    a light source unit including:
        a light source;
        a lens; and
        a case accommodating the light source and the lens, the case having three projections at respective locations on an outer surface thereof; and
    a holding body holding the light source unit, the holding body having a holding hole receiving the light source unit which is inserted therein along a center line of the holding hole,
    wherein a shape of a front surface of each projection is convex, and
    wherein the front surface of each projection and an edge portion of the holding hole are in contact with and fixed to each other such that an optical axis of the light source unit is directed in a predetermined direction.

2. The light-emitting device according to claim 1, wherein a cross-section of the front surface of each of the projections in a plane including the center line has a convex curve belonging to an imaginary spherical surface having a curvature center on the center line of the holding hole.

3. The light-emitting device according to claim 1, wherein a cross-section of the front surface of each projection in a plane orthogonal to the center line and including a contact portion of the front surface and the edge portion has a convex curve having a first curvature radius, and a cross-section of an inner periphery of the holding hole in the plane has a concave curve having a second curvature radius greater than the first curvature radius.

4. The light-emitting device according to claim 1, wherein each projection and the edge portion are securely fixed to each other.

5. The light-emitting device according to claim 1,
    wherein a plurality of light source units and corresponding holding bodies are provided at a plurality of locations, and
    wherein respective light beams emitted from the light source units are aligned with a same optical axis before being output from the light-emitting device.

6. The light-emitting device according to claim 1, wherein the front surface of each of the projections belongs to a first imaginary spherical surface having a first curvature center on the center line of the holding hole and a first curvature radius, and wherein a portion of an inner periphery of the holding hole which is connected to the edge portion has a concave surface belonging to a second imaginary surface having a second curvature center on the center line and a second curvature radius, the second curvature center being located closer to the edge portion than the first curvature center, and the second curvature radius being smaller than the first curvature radius.

7. The light-emitting device according to claim 1, wherein the holding body has a mark indicating a circumferential location of a contact position of the edge portion and the front surface of each protrusion.

8. The light-emitting device according to claim 1, wherein the case has a mark indicating a circumferential location of a contact position of the edge portion and the front surface of each protrusion.

9. The light-emitting device according to claim 1, wherein a portion of an inner periphery of the holding hole which is connected to the edge portion has a concave surface having a curvature radius smaller than a curvature radius of the convex front surface of each projection.

10. The light-emitting device according to claim 9, wherein the concave surface of the inner periphery belongs to an imaginary spherical surface having a curvature center on the center line of the holding hole.

* * * * *